United States Patent
Kabir et al.

(10) Patent No.: US 8,723,712 B1
(45) Date of Patent: May 13, 2014

(54) DIGITAL TO ANALOG CONVERTER WITH CURRENT STEERING SOURCE FOR REDUCED GLITCH ENERGY ERROR

(71) Applicant: Freescale Semiconductor, Inc., Austin, TX (US)

(72) Inventors: Mohammad Nizam U. Kabir, Tempe, AZ (US); Brandt Braswell, Chandler, AZ (US); Douglas A. Garrity, Gilbert, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/742,532

(22) Filed: Jan. 16, 2013

(51) Int. Cl.
*H03M 1/66* (2006.01)

(52) U.S. Cl.
USPC ........... 341/144; 327/157; 327/149; 327/158; 327/161; 327/108; 326/30; 326/80; 326/86; 326/83; 326/90; 326/121; 326/127; 326/115

(58) Field of Classification Search
USPC .......... 341/140–144; 327/149, 157, 158, 161, 327/108; 326/30, 80, 86, 83, 90, 121, 127, 326/115
See application file for complete search history.

(56) References Cited

U.S. PATENT DOCUMENTS

| | | | |
|---|---|---|---|
| 5,625,360 A | 4/1997 | Garrity et al. | |
| 5,801,578 A * | 9/1998 | Bereza | 327/536 |
| 6,473,015 B2 * | 10/2002 | Andersson | 341/136 |
| 6,664,906 B2 | 12/2003 | Volk | |
| 6,720,898 B1 * | 4/2004 | Ostrem | 341/144 |
| 6,985,028 B2 * | 1/2006 | Lee et al. | 327/543 |
| 7,012,473 B1 * | 3/2006 | Kokolakis | 331/17 |
| 7,253,663 B2 * | 8/2007 | Cho et al. | 326/115 |
| 7,355,541 B2 * | 4/2008 | Schwoerer | 341/144 |
| 7,417,463 B1 * | 8/2008 | Danesh et al. | 326/86 |
| 7,495,477 B2 * | 2/2009 | Cho et al. | 326/115 |
| 7,626,424 B2 * | 12/2009 | Danesh et al. | 326/86 |
| 7,795,953 B2 * | 9/2010 | Ogiwara et al. | 327/541 |
| 7,812,641 B2 * | 10/2010 | Danesh et al. | 326/86 |
| 7,893,719 B2 * | 2/2011 | Lee et al. | 326/86 |

OTHER PUBLICATIONS

Van Den Bosch, Anne et al. "A 10-bit 1-GSample/s Nyquist Current-Steering CMOS D/A Converter." IEEE Journal of Solid-State Circuits, vol. 36, No. 3, Mar. 2001 pp. 315-324.
Deveugele, Jurgen et al. "A 10-bit 250-MS/s Binary-Weighted Current-Steering DAC." IEEE Journal of Solid-State Circuits, vol. 41, No. 2, Feb. 2006 pp. 320-329.

(Continued)

*Primary Examiner* — Lam T Mai
(74) *Attorney, Agent, or Firm* — Gary Stanford (57) ABSTRACT

A digital to analog converter including at least one current steering source and a master replica bias network. Each current steering source includes a data current source, two switches, two buffer devices, and two activation current sources. The switches are controlled by a data bit and its inverse for switching the source current between first and second control nodes. The buffer devices buffer the control nodes between corresponding output nodes. The activation current sources ensure that each buffer device remains active regardless of the state of the switches. The master replica bias network includes a replica buffer device coupled to a replica control node and a master buffer amplifier. The master buffer amplifier drives the first, second and replica buffer devices in parallel to maintain the first, second and replica control nodes at a common master control voltage to minimize noise and glitches at the output.

20 Claims, 3 Drawing Sheets

(56) References Cited

OTHER PUBLICATIONS

Doris, K et al. "A 12b 500MS/s DAC with >70dB SFDR up to 120 MHz in 0.18 μm CMOS." ISSCC 2005 / Session 6 /High-Speed and Oversampled DACs / 6.4 2005 IEEE International Solid State Circuits Conference pp. 116-117 and p. 588.

Lin, Chi-Hung et al. "A 10-b, 500-MSample/s CMOS DAC in 0.6 $mm^2$" IEEE Journal of Solid-State Circuits, vol. 33, No. 12, Dec. 1998 pp. 1948-1958.

Lin, Chi-Hung et al. "A 12 bit 2.9 GS/s DAC With IM3 < -60 dBc Beyond 1 GHz in 65 nm CMOS." IEEE Journal of Solid-State Circuits, vol. 44, No. 12, Dec. 2009 pp. 3285-3293.

* cited by examiner

DIGITAL TO ANALOG CONVERTER WITH CURRENT STEERING SOURCE FOR REDUCED GLITCH ENERGY ERROR

BACKGROUND OF THE INVENTION

1. Field of the Invention

The present invention relates generally to digital to analog converters (DACs), and more particularly to a current steering source for a DAC using a master bias network to reduce glitch energy error.

2. Description of the Related Art

A digital to analog converter (DAC) is an electronic circuit that converts an input digital signal to an output analog signal. A numerical value represented by the digital signal input to the DAC corresponds with a magnitude of the analog signal output by the DAC. Various factors determine the performance of a DAC, including speed, resolution, and noise. Speed refers to the amount of time the DAC converts the digital value to a stable analog signal. Resolution refers to the smallest incremental signal that is generated by the DAC and corresponds with the Least Significant Bit (LSB) of the input digital signal. Noise refers to deviations of the output analog signal relative to an expected or desired level, particularly during switching from one digital value to another.

High performance DACs are useful for converting data with high resolution at high frequency and low noise. The current-steering architecture is the architecture of choice for fast-sampling applications, in which each bit or converted data bit is used to switch current from a current source between a pair of nodes. High frequency current steering DACs often exhibit non-ideal behaviors in the form of glitch energy and/or rise time and fall time mismatch particularly during dynamic switching between digital codes. The dynamic performance degradation of a current steering DAC may be caused, for example, by the coupling of control signals through switches to the output. Various methods have been used in an attempt to improve behavior and performance, but many such conventional techniques introduce undesired timing differences or cause charge feed through and injection from switch control signal (e.g., clock signals) thereby causing glitch energy and other distortions at the output.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

The following description is presented to enable one of ordinary skill in the art to make and use the present invention as provided within the context of a particular application and its requirements. Various modifications to the preferred embodiment will, however, be apparent to one skilled in the art, and the general principles defined herein may be applied to other embodiments. Therefore, the present invention is not intended to be limited to the particular embodiments shown and described herein, but is to be accorded the widest scope consistent with the principles and novel features herein disclosed.

A current steering source for a digital to analog converter (DAC) according to embodiments described herein uses replica biasing and a master amplifier buffer to enable the use of different threshold devices to achieve very fast signal response and to reduce rising and falling edge mismatch. A system and method described herein reduces glitch energy error and achieves accurate step when changing from one digital value to another. The system and method described herein further reduces the clock signal swing to further reduce glitch energy and lower the rise and fall time mismatch. The dynamic performance is improved with a cascode transistor which remains on even when its corresponding current switch is turned off. Replica biasing ensures the source voltage for the cascode transistor remains constant which allows the use of larger, low threshold voltage transistors or smaller transistors with standard threshold voltage. The current steering source may be used for a binary DAC, a unary DAC, or within one or more portions of a segmented architecture.

Figure 1:
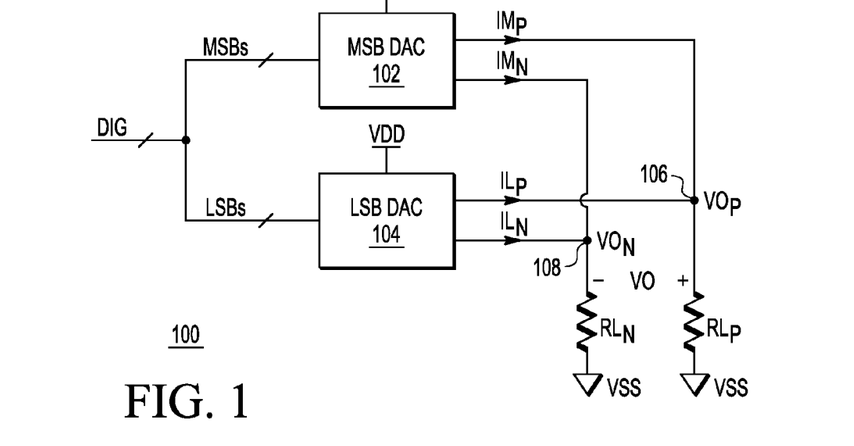
FIG. 1 is a simplified block diagram of a DAC implemented according to one embodiment.

FIG. 1 is a simplified block diagram of a DAC 100 implemented according to one embodiment. A multiple bit digital value DIG is provided at an input of the DAC 100, which develops a differential output voltage VO including a positive polarity voltage $VO_P$ across a load resistor $RL_P$ and a negative polarity voltage $VO_N$ across a load resistor $RL_N$. The DAC 100 is illustrated as a segmented architecture in which the most significant bits (MSBs) of the DIG value are provided to an MSB DAC 102 and the least significant bits (LSBs) are provided to an LSB DAC 104.

The total number of bits of DIG is divided between the MSBs and the LSBs and is determined according to the resolution desired for a given application. Furthermore, the number of MSBs and LSBs of the DIG value depends upon the particular configuration. Although the DIG bits may be divided equally between the MSBs and LSBs, alternative configurations are contemplated. For example, DIG may be 12 bits with a split of 6 MSBs and 6 LSBs (6/6), although non-symmetrical splits are contemplated for a given resolution, e.g., (4/8), (5/7), (7/5), (8/4), etc., for a 12-bit resolution.

The MSB DAC 102 and LSB DAC 104 are both configured according to a current steering architecture as further described below for developing current signals divided between load resistor $RL_P$ for developing a positive polarity $VO_P$ and load resistor $RL_N$ for developing a negative polarity $VO_N$ of the differential output voltage VO. The MSB DAC 102 steers current between a first current $IM_P$ and a second current $IM_N$ based on a value of the MSBs, and the LSB DAC 104 steers current between a first current $IL_P$ and a second current $IL_N$ based on a value of the LSBs. The currents $IM_P$ and $IL_P$ are summed at a positive polarity node 106 and applied to $RL_P$ for developing $VO_P$ and the currents $IM_N$ and $IL_N$ are summed at a negative polarity node 108 and applied to $RL_N$ for developing $VO_N$.

As shown, resistor $RL_P$ is coupled between node 106 and a supply reference node VSS which has any suitable negative, positive or ground reference voltage level. The resistor $RL_N$ is coupled between node 108 and VSS. The MSB DAC 102 and the LSB DAC 104 are coupled to a positive supply voltage VDD which has any suitable supply voltage level depending upon the particular technology used.

Figure 2:
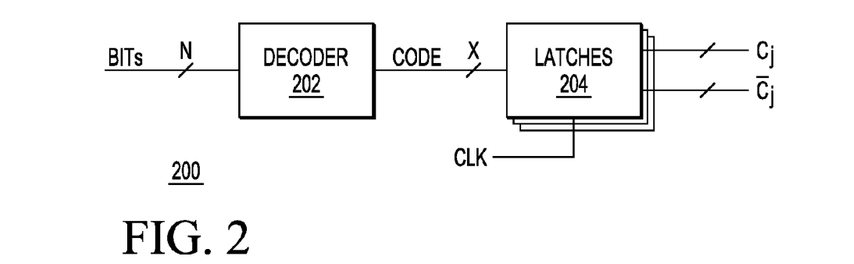
FIG. 2 is a simplified block diagram of a conversion network for either or both of the DACs of FIG. 1 according to a unary configuration.

FIG. 2 is a simplified block diagram of a conversion network 200 for either or both of the DACs 102 and 104 according to a unary configuration. A number "N" of input binary bit values shown as BITs, representing either the MSBs or the LSBs for a unary configuration, are provided to the respective inputs of a decoder 202. In one embodiment, the decoder 202 is configured as a binary to thermometer decoder in which N input BITs are converted to an output unary code value CODE including a number "X" binary CODE bits, in which N and X are both positive integers greater than 0. In one embodiment, the number X of CODE bits is $X=2^N$ in which the input BITs representing a natural or decimal number are converted to X CODE bits including N logical "1" binary values. As an example, for N=4, X=16, and an input value of 0111b representing a positive decimal number 7 is converted to a binary CODE value of 0000000001111111.

The X CODE bits are provided to respective inputs of a set of latches 204 receiving a clock signal CLK. The latches 204 convert each CODE bit into synchronized non-inverted code bits $C_j$ and inverted code bits $\overline{C}_j$, in which "j" is an index from 1 to X. An overstrike line or bar above a signal name denotes logical inversion of the corresponding signal. For example, when a one of the output code bits $C_j$ has a binary value of "1", then $\overline{C}_j$ has a binary value of "0" and vice-versa. The latches 204 operate to convert each CODE bit into corresponding ones of the code bits $C_j$ and $\overline{C}_j$ having corresponding transitions which are synchronized with operative edge transitions (rising or falling edges) of the clock signal CLK.

In one embodiment, both of the MSB DAC 102 and the LSB DAC 104 are implemented according to the unary configuration (i.e., unary/unary) shown in FIG. 2. As further described herein, each unary configured DAC includes a corresponding set of equivalent switchable or steering current sources which switch a common current value between the positive and negative polarity nodes 106 and 108 depending upon corresponding ones of the code bits $C_j$ and $\overline{C}_j$. For the unary/unary configuration, the current level associated with each bit of the MSB DAC 102 is greater than the current level associated with each bit of the LSB DAC 104, in which the current ratio is determined according to the binary value of the MSBs relative to the LSBs.

In an alternative embodiment, a binary configuration of the conversion network 200 is contemplated in which each BIT value is provided directly to the latches 204 (bypassing the decoder 202) for developing a corresponding one of the code bits $C_j$ and $\overline{C}_j$, each code bit pair representing a corresponding input BIT value. In one embodiment, a unary/binary configuration is contemplated in which the MSB DAC 102 is implemented according to a unary configuration and the LSB DAC 104 is implemented according to a binary configuration. In the binary configuration case, the corresponding DAC includes a set of binary weighted switchable or steering current sources, in which a next and more significant bit value corresponds with a current source providing twice the current level, e.g., weighted current level values $I\cdot2^0, I\cdot2^1, I\cdot2^2, \ldots, I\cdot2^N$, in which "I" is an LSB current level.

Figure 3:
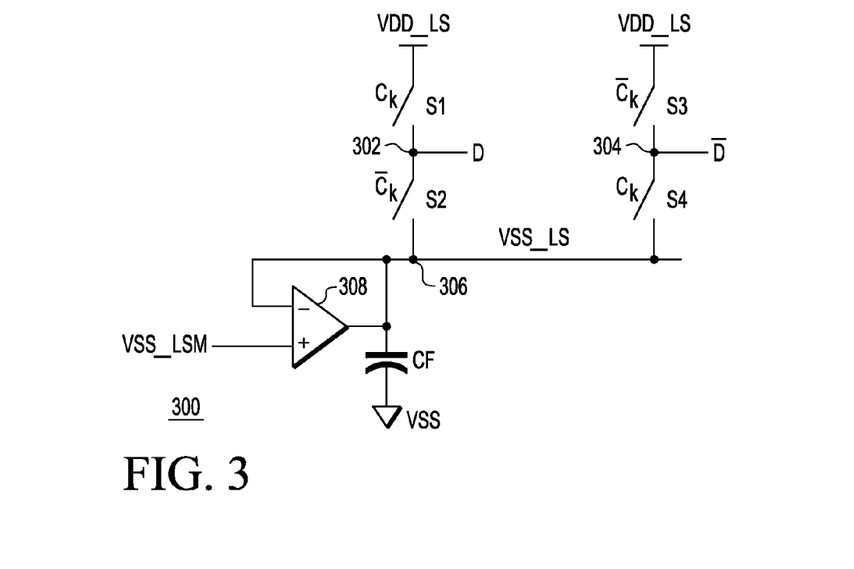
FIG. 3 is a schematic diagram of a level shifter implemented according to one embodiment which may be used between the conversion network of FIG. 2 and the current source of FIG. 4.

FIG. 3 is a schematic diagram of a level shifter 300 implemented according to one embodiment. A set of four switches S1, S2, S3 and S4 are controlled by a pair of code bits $C_k$ and $\overline{C}_k$ output from a corresponding one (or corresponding ones) of the latches 204, where subscript "k" denotes a representative one of the j code bits. Switch S1 is coupled between a level-shifted supply voltage VDD_LS and a node 302 and is controlled by code bit $C_k$. Switch S2 is coupled between node 302 and a level shifted supply voltage node 306 and is controlled by code bit $\overline{C}_k$. Similarly, switch S3 is coupled between VDD_LS and a node 304 and is controlled by code bit $\overline{C}_k$, and switch S4 is coupled between nodes 304 and 306 and is controlled by code bit $C_k$. An amplifier 308 has a positive input receiving a level-shifted supply voltage VSS_LSM and has a negative input and output coupled together at node 306. A filter capacitor CF is coupled between node 306 and VSS. Node 302 asserts a representative data bit $D_k$ and node 304 asserts a data bit $\overline{D}_k$, in which $\overline{D}_k$ is the logical inverse of $D_k$.

In one embodiment, VDD_LS is level shifted relative to VDD, such as having a predetermined or fixed voltage level offset from VDD by a predetermined amount. Alternatively, VDD_LS may be offset from VDD by an adjustable amount. In any case, assuming VDD has a fixed positive voltage level, then VDD_LS is shifted by the offset amount to a lower voltage level for reducing overall voltage switching range as further described herein. In another embodiment, VDD_LS may be coupled to or otherwise replaced by VDD in which the upper voltage level is not shifted.

In one embodiment, VSS_LS is level-shifted relative to VSS, such as having a predetermined or fixed voltage level offset from VSS by a predetermined amount. Alternatively, VSS_LS may be offset from VSS by an adjustable amount. In any case, assuming VSS is less than VDD, then VSS_LS is shifted by an offset amount to a higher voltage level for reducing overall voltage switching range as further described herein. The amplifier 308 is configured as a unity gain amplifier or buffer amplifier so that the voltage level of VSS_LS follows the same voltage level as VSS_LSM. VSS_LSM is set by an external voltage source (not shown).

In operation, the code bits $C_k$ and $\overline{C}_k$ are synchronously asserted by the latches 204 to opposite logic levels between VDD and VSS. When $C_k$ is high, switches S1 and S4 are closed and $\overline{C}_k$ is low, opening switches S2 and S3. Thus, the $D_k$ bit asserted by node 302 is pulled high to VDD_LS and the inverted $\overline{D}_k$ bit is pulled low to VSS_LS. Also, when $C_k$ is low, switches S1 and S4 are opened and $\overline{C}_k$ is high, closing switches S2 and S3. Thus, the $D_k$ bit asserted by node 302 is pulled low to VSS_LS and the inverted $\overline{D}_k$ bit is pulled high to VDD_LS. In this manner, $D_k$ and $\overline{D}_k$ are synchronously asserted to opposite logical states between shifted voltage level VSS_LS and VDD_LS in response to corresponding synchronous transitions of $C_k$ and $\overline{C}_k$ switched between VSS and VDD. Thus, the data bits $D_k$ and $\overline{D}_k$ are synchronously switched within a reduced voltage range between VSS_LS and VDD_LS in response to a corresponding CODE value asserted by the decoder 202 or from a corresponding one of the MSBs or LSBs.

Figure 4:
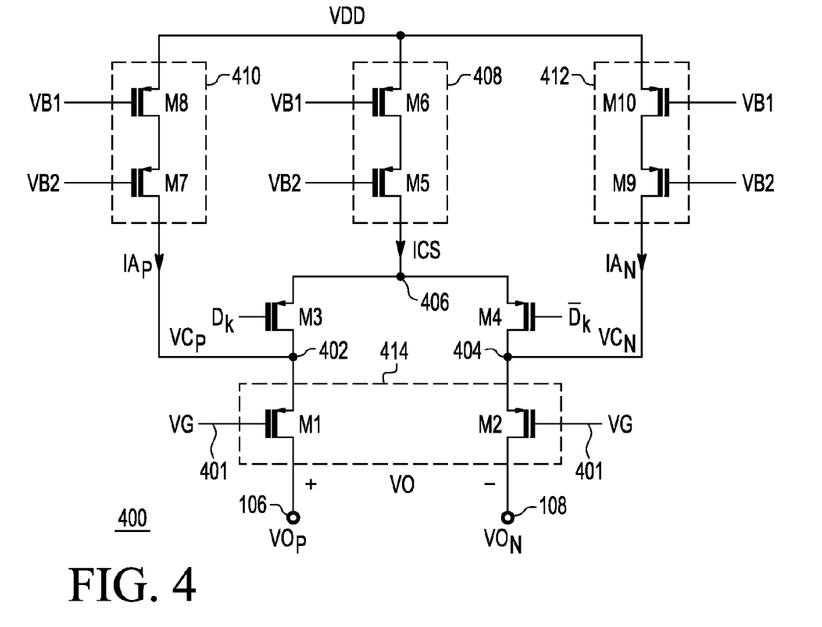
FIG. 4 is a schematic diagram of a current steering source used within either or both of the DACs of FIG. 1.

FIG. 4 is a schematic diagram of a current steering source 400 used within either or both of the MSB DAC 102 and the LSB DAC 104 and controlled by the data bit pair $D_k$ and $\overline{D}_k$. A separate current steering source is provided for each synchronous pair of code or date bits. A first P-type MOS (metal-oxide semiconductor) (PMOS) transistor M1 has its source coupled to a first control node 402, its drain coupled to node 106, and its gate receiving a gate voltage signal VG developed on a buffer control node 401. A second PMOS transistor M2 has its source coupled to a second control node 404, its drain coupled to node 108, and its gate coupled to node 401 and receiving the VG signal. M1 and M2 are first and second buffer devices, respectively, which are driven by a common gate voltage VG on node 401. A third PMOS transistor M3 has its source coupled to a source node 406, its drain coupled to node 402, and its gate receiving the non-inverted data bit $D_k$. A fourth PMOS transistor M4 has its source coupled to node 406, its drain coupled to node 404, and its gate receiving the inverted data bit $\overline{D}_k$. M3 and M4 are first and second switches controlled by $D_k$ and $\overline{D}_k$, respectively. A fifth PMOS transistor M5 has its source coupled to the drain of a sixth PMOS transistor M6, its drain coupled to node 406, and its gate receiving a bias voltage VB2. M6 has its source coupled to VDD and its gate receiving a bias voltage VB1.

A seventh PMOS transistor M7 has its source coupled to the drain of an eighth PMOS transistor M8, its drain coupled to node 402, and its gate receiving the VB2 bias voltage. M8 has its source coupled to VDD and its gate receiving the VB1 bias voltage. A ninth PMOS transistor M9 has its source coupled to the drain of a tenth PMOS transistor M10, its drain coupled to node 404, and its gate receiving the VB2 bias voltage. M10 has its source coupled to VDD and its gate receiving the VB1 bias voltage.

M6 and M5 collectively form a data current source 408 providing a source current ICS to node 406. M3 and M4 are the main data switching devices in which the ICS current is directed to node 402 when $D_k$ is high turning M3 on and $\overline{D}_k$ is low turning M4 off. Similarly, ICS is directed to node 404 when $D_k$ is low turning M3 off and $\overline{D}_k$ is high turning M4 on. M1 and M2 are buffer devices which are driven by the same gate voltage VG. M7 and M8 collectively form a first activation current source 410 providing a first activation current $IA_P$ to node 402, and M9 and M10 collectively form a second activation current source 412 providing a second activation current $IA_N$ to node 404. $IA_P$ is configured to have a sufficient current level such that even when M3 is off and M4 is on, M1 is maintained in saturation so that the current $IA_P$ is continuously provided to node 106. Similarly, $IA_N$ is configured to have a sufficient current level such that even when M4 is off and M3 is on, M2 is maintained in saturation so that the current $IA_N$ is continuously provided to node 108. M1 and M2 collectively form a data buffer 414 in which M1 is a first buffer device and M2 is a second buffer device for buffering the data current signals to the positive and negative polarity nodes 106 and 108, respectively.

The current steering source 400 may be repeated for each bit value for a binary configuration or for each CODE bit for a unary configuration. In one embodiment, M1 and M2 are the same size, M7 and M9 are the same size, and M8 and M10 are the same size in which $IA_P$ is substantially equal to $IA_N$. M5 and M6 are sized according to the desired current level of ICS. The combined current level of ICS and either $IA_P$ or $IA_N$ is configured to provide the desired current level for the corresponding bit of the input value DIG.

In a unary configuration with N input bits, X corresponding current steering sources are provided, each configured similarly to the current steering source 400, in which $D_k$ and $\overline{D}_k$ are synchronously switched in response to a corresponding input bit. Each corresponding M5 device is substantially the same size for each current steering source 400, and similarly each corresponding M6 device is substantially the same size for each current steering source 400 within the same DAC (LSB or MSB) in which ICS is also substantially the same. The ICS current of the sources within the MSB DAC 102 is a selected factor greater than the ICS current of the sources within the LSB DAC 104.

In a binary configuration with N input bits, N corresponding current steering sources are provided, each configured similarly to the current steering source 400, in which $D_k$ and $\overline{D}_k$ are synchronously switched in response to a corresponding input bit. M5 and M6 are each sized based on the bit position of the corresponding current steering source 400 within the same DAC (LSB or MSB) in which ICS is based on the relative sizes of M5 and M6 in each current steering source. The ICS current from one current steering source to the next increases two-fold according to the binary configuration to achieve the binary-weighted function.

Figure 5:
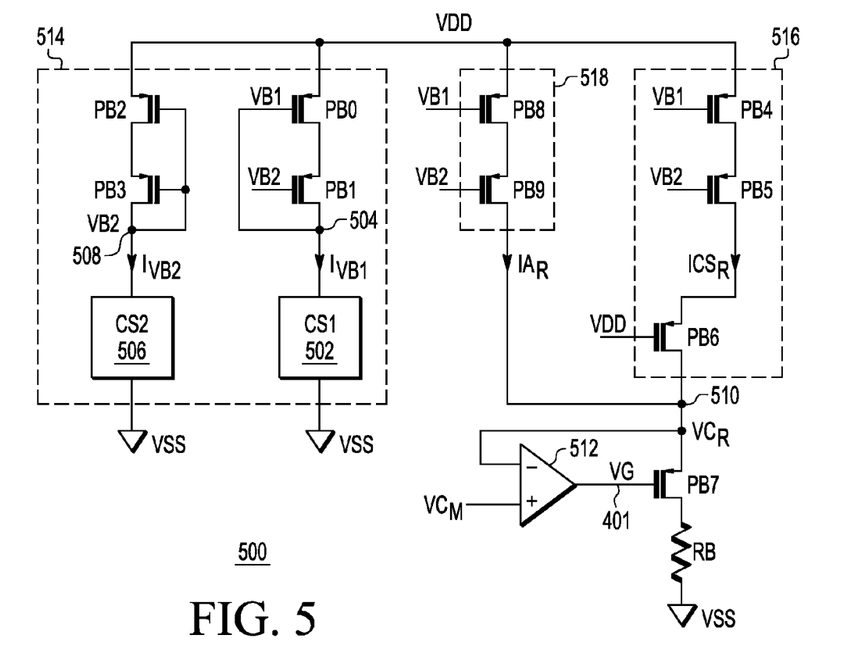
FIG. 5 is a schematic and block diagram of a master replica bias network used for setting the bias voltages of the current steering source of FIG. 4, and further for driving the VG voltage to ensure that the first and second control nodes of the current steering source of FIG. 4 are driven to a common master control voltage.

FIG. 5 is a schematic and block diagram of a "master" replica bias network 500 used for setting the bias voltages VB1 and VB2 of the current steering source 400, and further for driving the VG voltage to ensure that the first and second control nodes 402 and 404 of the current steering source 400 are driven to a common master control voltage $VC_M$. As noted above, the current steering source 400 is repeated for each data bit (or bit pair), whereas one master replica bias network 500 is provided for multiple ones (or even all of) the current steering sources. The master replica bias network 500 includes a master bias network 514 including first and second current sink devices CS1 502 and CS2 504, and PMOS transistors PB0, PB1, PB2 and PB3. The first current sink device CS1 502 develops a first bias current $I_{VB1}$ through PB0 and PB1 which are coupled in series between VDD and a node 504. As shown, the source of PB0 is coupled to VDD and its drain is coupled to the source of PB1, having its drain coupled to the gate of PB0 at node 504 which develops the first bias voltage VB1. The second current sink device CS2 506 develops a second bias current $I_{VB2}$ through PB2 and through PB3, which is diode-coupled. As shown, the source of PB2 is coupled to VDD, its drain is coupled to the source of PB3, and the gates of PB2 and PB3 and the drain of PB3 are coupled together at a node 508 developing the second bias voltage VB2. VB2 is provided to the gate of PB1. In one embodiment, the current sink devices CS1 502 and CS2 506 may develop temperature independent current levels, such as configured using band-gap devices or the like.

A replica data current source 516 is configured using PMOS devices PB4, PB5 and PB6 for developing a replica source current $ICS_R$ to a replica control node 510. As shown, the source of PB4 is coupled to VDD, its drain is coupled to the source of PB5, having its drain coupled to the source of PB6. The drain of PB6 is coupled to node 510. The gates of PB4, PB5 and PB6 receive voltages VB1, VB2 and VDD, respectively. PB4, PB5 and PB6 effectively replicate the structure of M6, M5 and the active one of M3 or M4 of the current steering source 400 in which ICS is developed proportional to $ICS_R$.

A replica activation current source 518 is configured using PMOS devices PB8 and PB9 for developing a replica activation current $IA_R$ to the replica source node 510. As shown, the source of PB8 is coupled to VDD, its drain is coupled to the source of PB9, having its drain coupled to node 510. The gates of PB8 and PB9 receive the bias voltages VB1 and VB2, respectively. PB8 and PB9 effectively replicate the structure of M8 and M7 or M10 and M9 of the current steering source 400 in which $IA_P$ and $IA_N$ are both developed proportional to the replica activation current $IA_R$.

A master buffer amplifier 512 receives the master control voltage $VC_M$ at its positive input and has its negative input coupled to node 510. The output of the amplifier 512 asserts the VG signal on the buffer control node 401 which is coupled to the gate of another PMOS transistor PB7. The source of PB7 is coupled to the replica control node 510 and its drain is coupled to one end of a bias resistor RB at a bias node, in which the RB its other end coupled to VSS. As previously described for the current steering source 400, VG is also provided to the gates of the buffer devices M1 and M2. PB7 serves as a replica buffer device coupled to the replica control node 510 which replicates biasing of the first and second buffer devices M1 and M2.

In operation, the amplifier 512 controls the voltage level of VG to control PB7 so that node 510 develops a replica control voltage $VC_R$ substantially equal to the master control voltage $VC_M$. $VC_M$ is provided by another device (not shown) for establishing the desired voltage level of $VC_R$. Since VG is further provided to the gates of the first and second buffer devices M1 and M2, the amplifier 512 operates to control the PB7, M1 and M2 transistors to drive the voltages $VC_R$, $VC_P$ and $VC_N$ of nodes 510, 402 and 404, respectively, to each be substantially equal to the master control voltage $VC_M$. In particular, the amplifier 512 adjusts VG to maintain $VC_R$, $VC_P$ and $VC_N$ to be substantially equal to $VC_M$ and thus substantially equal to each other. Although the first and second control nodes 402 and 404 are effectively isolated from each other and from the replica control node 510, the master buffer amplifier 512 simultaneously drives the replica, first and second buffer devices PB7, M1 and M2 to establish a "soft" coupling between these control nodes, so that the replica, first and second control nodes 510, 402 and 404 are driven to the same voltage level as the common master control voltage $VC_M$. Furthermore, the amplifier 512 maintains the voltages $VC_R$, $VC_P$ and $VC_N$ relatively constant during switch transitions.

The master buffer amplifier 512 of the master replica bias network 500 ensures constant source voltages of $VC_R$, $VC_P$ and $VC_N$ by adjusting VG with changes of process and temperature. This function helps to provide greater voltage headroom which enables a reduction of the sizes of the M3 and M4 switching transistors. This is particularly advantageous for an MSB DAC having a higher current level relative to a corresponding LSB DAC.

The replica biasing provided by the master replica bias network 500 and the level shifting provided by the level shifter 300 each contribute to reducing the glitch energy and the rise and fall timing mismatch of each current steering source 400 within a given DAC, such as either or both MSB DAC 102 and LSB DAC 104. The replica biasing enables the use of different threshold devices without introducing any reliability issues in order to achieve very fast rising and falling signal transitions with reduced transition mismatch to achieve very accurate steps. The replica biasing and level shifting further reduces clock signal swing to reduce glitch energy and lower rise/fall time mismatch.

Figure 6:
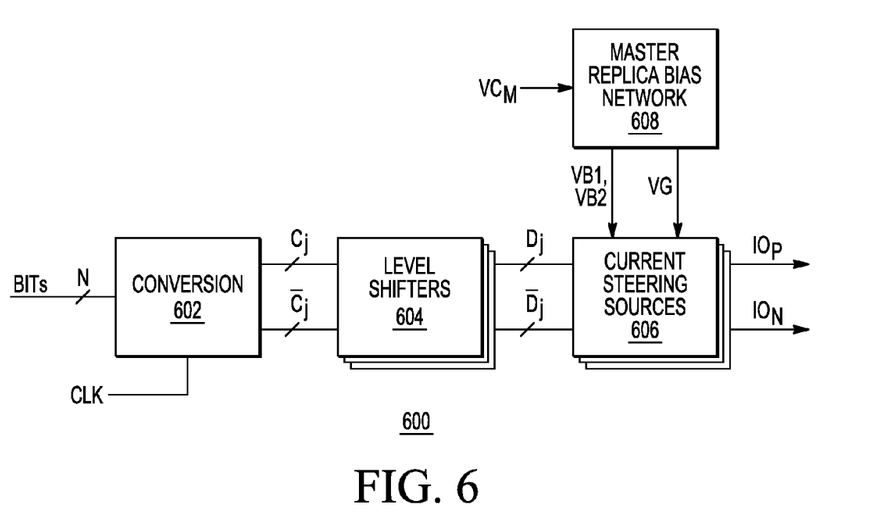
FIG. 6 is a simplified block diagram of a DAC implemented according to one embodiment representing one of the MSB or LSB DACs of FIG. 1 and illustrating exemplary relationships between the functional circuits previously described.

FIG. 6 is a simplified block diagram of a DAC 600 implemented according to one embodiment representing one of the DACs 102 or 104 and illustrating exemplary relationships between the functional circuits previously described. The N BITs representing either the MSBs or the LSBs are provided to respective inputs of a conversion network 602, which may be implemented according to a unary or a binary configuration. For the unary configuration, the conversion network 602 may be implemented in a similar manner as the conversion network 200 including a decoder (e.g., decoder 202) receiving the BITs and providing corresponding code bits (e.g., X CODE bits) to a set of latches (e.g., latches 204), which provides the output code bits $C_j$ and corresponding inverted code bits $\overline{C}_j$. In the binary configuration, the conversion network 602 may not include a decoder in which the BITs are provided directly to the latches. The conversion network 602 operates to convert each of the BITs or code bits into corresponding ones of the j code bit pairs $C_j$ and $\overline{C}_j$ having corresponding transitions which are synchronized with operative edge transitions (rising or falling edges) of the clock signal CLK.

The code bit pairs $C_j$ and $\overline{C}_j$ may be provided to respective inputs of a set of level shifters 604, each converting a corresponding pair of the code bits $C_j$ and $\overline{C}_j$ into a corresponding pair of the data bit pairs $D_j$ and $\overline{D}_j$. Each of the level shifters 604 may be configured in a similar manner as the level shifter 300. Level shifting may be bypassed in which the level shifters 604 are configured for bypass (e.g., VDD_LS=VDD and VSS_LSM=VSS) so that the code bit pairs $C_j$ and $\overline{C}_j$ pass unmodified as the data bit pairs $D_j$ and $\overline{D}_j$. Alternatively, the level shifters 604 are not provided or the code bit pairs $C_j$ and $\overline{C}_j$ pass directly as the as the data bit pairs $D_j$ and $\overline{D}_j$.

The data bit pairs $D_j$ and $\overline{D}_j$ are provided to respective inputs of a set of current steering sources 606, which collectively provide first and second output currents $IO_P$ and $IO_N$. The output currents $IO_P$ and $IO_N$ may be provided to corresponding summing nodes for developing corresponding output voltages in a similar manner as shown in FIG. 1. Each of the current steering sources 606 may be configured in substantially the same or similar manner as the current steering source 400. A master replica bias network 608 is provided to provide bias voltages (e.g., VB1, VB2) for biasing each of the current steering sources 606. Also, the master replica bias network 608 receives the common master control voltage $VC_M$ and provides the VG voltage to each of the current steering sources 606. The master replica bias network 608 may be configured in substantially the same or similar manner as the master replica bias network 608 500.

A current steering source with reduced glitch energy as described herein may be used an for an electronic system requiring a very low glitch DAC. The DAC may generate an analog falling ramp signal for a voltage-controlled oscillator (VCO, not shown) with very accurate step size from a digital ramp. The accuracy of the output step achieved is less than 0.05 LSB of a 12-bit DAC. Fall time mismatch for falling steps is less than 1 nanoseconds (ns) over the entire range of the ramp.

A digital to analog converter according to one embodiment includes at least one current steering source and a master replica bias network. Each current steering source includes a data current source providing a source current to a source node, first and second switches, first and second buffer devices, and first and second activation current sources. The first switch has a first terminal coupled to the source node and a second terminal coupled to a first control node. The second switch has a first terminal coupled to the source node and a second terminal coupled to a second control node. The first and second switches are controlled by a data bit and an inverted data bit, respectively, which are collectively configured to activate one of the switches at a time to steer the source current to a selected one of the first and second control nodes. The first buffer device has a first terminal coupled to the first control node and a second terminal coupled to a first current output node. The second buffer device has a first terminal coupled to said second control node and has a second terminal coupled to a second current output node. The first activation current source is configured to provide a first activation current to the first buffer device via the first control node, and a second activation current source which is configured to provide a second activation current to the second buffer device via the second control node. The master replica bias network includes a replica buffer device and a master buffer amplifier.

The replica buffer device is coupled to a replica control node and which is configured to replicate biasing of at least one of the first and second buffer devices. The master buffer amplifier has an output configured to drive the first and second buffer devices and the replica buffer device in parallel to maintain the first, second and replica control nodes at a common master control voltage.

A method of steering current for a digital to analog converter according to one embodiment includes providing a source current to a source node, directing the source current to one of first and second control nodes based on a state of a data bit, buffering current between the first control node and a first output node using a first buffer device and buffering current between the second control node and a second output node using a second buffer device, providing a first activation current to the first control node at a level sufficient to keep the first buffer device active when the source current is directed to the second control node via the second buffer device, and providing a second activation current to the second control node at a level sufficient to keep the second buffer device active when the source current is directed to the first control node via the first buffer device, providing a replica source current to a replica control node coupled to a replica bias device, in which the replica source current replicates the source current, providing a replica activation current to the replica control node, in which the replication activation current replicates at least one of the first and second activation currents, and driving the first buffer device, the second buffer device and the replica buffer device in parallel with a buffer amplifier which receives a master control voltage and which has a feedback coupling with the replica control node to drive the first, second and replica control nodes towards a voltage level of the master control voltage.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims. Unless stated otherwise, terms such as "first" and "second" are used to arbitrarily distinguish between the elements such terms describe. Thus, these terms are not necessarily intended to indicate temporal or other prioritization of such elements.

The invention claimed is:

1. A digital to analog converter, comprising:
   at least one current steering source, each comprising:
      a data current source providing a source current to a source node;
      a first switch having a first terminal coupled to said source node and having a second terminal coupled to a first control node, and a second switch having a first terminal coupled to said source node and having a second terminal coupled to a second control node, wherein said first and second switches are controlled by a data bit and an inverted data bit, respectively, which are collectively configured to activate one of said first and second switches at a time to steer said source current to a selected one of said first and second control nodes;
      a first buffer device having a first terminal coupled to said first control node and having a second terminal coupled to a first current output node and a second buffer device having a first terminal coupled to said second control node and having a second terminal coupled to a second current output node; and
      a first activation current source which is configured to provide a first activation current to said first buffer device via said first control node, and a second activation current source which is configured to provide a second activation current to said second buffer device via said second control node; and
   a master replica bias network, comprising:
      a replica buffer device coupled to a replica control node and which is configured to replicate biasing of at least one of said first and second buffer devices; and
      a master buffer amplifier having an output configured to drive said first and second buffer devices and said replica buffer device in parallel to maintain said first, second and replica control nodes at a common master control voltage.

2. The digital to analog converter of claim 1, wherein said master replica bias network further comprises:
   a replica data current source which is configured to replicate said data current source and to provide a replica source current to said replica control node; and
   a replica activation current source which is configured to replicate at least one of said first and second activation current sources and to provide a replica activation current to said replica control node.

3. The digital to analog converter of claim 1, wherein said first switch comprises a first transistor having a first current terminal coupled to said source node, having a second current terminal coupled to said first control node and having a control terminal receiving said data bit, and wherein said second switch comprises a second transistor having a first current terminal coupled to said source node, having a second current terminal coupled to said second control node and having a control terminal receiving said inverted data bit.

4. The digital to analog converter of claim 1, wherein said first buffer device comprises a first transistor having a first current terminal coupled to said first control node, having a second current terminal coupled to said first current output node and having a control terminal coupled to a buffer control node which is coupled to an output of said master buffer amplifier, wherein said second buffer device comprises a second transistor having a first current terminal coupled to said second control node, having a second current terminal coupled to said second current output node and having a control terminal coupled to said buffer control node, and wherein said replica buffer device comprises a third transistor having a first current terminal coupled to said replica control node, having a second current terminal coupled to a bias node and having a control terminal coupled to said buffer control node.

5. The digital to analog converter of claim 4, wherein said master buffer amplifier comprises an operational amplifier having a non-inverting input receiving said common master control voltage, having an inverting input coupled to said replica control node, and having an output coupled to said buffer control node.

6. The digital to analog converter of claim 1, further comprising a level shifter receiving a code bit and an inverted code bit and providing said data bit and said inverted data bit, wherein said data bit and said inverted data bit are voltage-shifted versions of said code bit and said inverted code bit, respectively.

7. The digital to analog converter of claim 1, further comprising a latch receiving a binary input bit and a clock signal, wherein said latch is configured synchronize switching of said data bit and said inverted data bit to opposite logic states based on switching of said input binary bit between said opposite logic states.

8. The digital to analog converter of claim 1, wherein:
said data current source comprises a first pair of transistors coupled in series having a first current terminal coupled to a supply node, having a second current terminal coupled to said source node and having first and second control terminals receiving first and second master bias voltages, respectively;
wherein said first activation current source comprises a second pair of transistors coupled in series having a first current terminal to said supply node, having a second current terminal coupled to said first control node and having third and fourth control terminals receiving said first and second master bias voltages, respectively; and
wherein said second activation current source comprises a third pair of transistors coupled in series having a first current terminal coupled to said supply node, having a second current terminal coupled to said second control node and having fifth and sixth control terminals receiving said first and second master bias voltages, respectively.

9. The digital to analog converter of claim 8, wherein said master replica bias network further comprises:
a replica data current source, comprising:
a fourth pair of transistors coupled in series having a first current terminal coupled to said supply node, having a second current terminal coupled to an intermediate node and having seventh and eighth control terminals receiving said first and second master bias voltages, respectively; and
a replica switch transistor having a first current terminal coupled to said intermediate node, a second current terminal coupled to said replica control node and having a control node coupled to said supply node; and
a replica activation current source comprising a fifth pair of transistors coupled in series having a first current terminal coupled to said supply node, having a second current terminal coupled to said replica control node and having ninth and tenth control terminals receiving said first and second master bias voltages, respectively.

10. The digital to analog converter of claim 9, wherein said master replica bias network further comprises a master bias network which is configured to develop said first and second master bias voltages based on first and second bias currents.

11. The digital to analog converter of claim 1, further comprising:
a conversion network which converts a plurality of input bits into a plurality of data bits and a corresponding plurality of inverted data bits; and
wherein said at least one current steering source comprises a plurality of current steering sources each receiving a corresponding pair of said plurality of data bits and inverted data bits.

12. The digital to analog converter of claim 11, wherein said conversion network comprises a plurality of level shifters for shifting switching voltage level of said plurality of data bits and said plurality of inverted data bits.

13. The digital to analog converter of claim 11, wherein said conversion network comprises a plurality of latches for synchronizing switching between said plurality of data bits and said plurality of inverted data bits.

14. The digital to analog converter of claim 11, wherein said conversion network comprises:
a decoder which converts said plurality of input bits into a corresponding plurality of code bits; and
a plurality of latches, wherein each of said plurality of latches converts a corresponding one of said plurality of code bits into a synchronized pair of data and inverted data bits.

15. A method of steering current for a digital to analog converter, comprising:
providing a source current to a source node;
directing the source current to one of first and second control nodes based on a state of a data bit;
buffering current between the first control node and a first output node using a first buffer device and buffering current between the second control node and a second output node using a second buffer device;
providing a first activation current to the first control node at a level sufficient to keep the first buffer device active when the source current is directed to the second control node via the second buffer device, and providing a second activation current to the second control node at a level sufficient to keep the second buffer device active when the source current is directed to the first control node via the first buffer device;
providing a replica source current to a replica control node coupled to a replica bias device, wherein the replica source current replicates the source current;
providing a replica activation current to the replica control node, wherein the replication activation current replicates at least one of the first and second activation currents; and
driving the first buffer device, the second buffer device and the replica buffer device in parallel with a buffer amplifier which receives a master control voltage and which has a feedback coupling with the replica control node to drive the first, second and replica control nodes towards a voltage level of the master control voltage.

16. The method of claim 15, wherein said directing the source current comprises controlling a first switch coupled between the source node and the first control node with a data bit and controlling a second switch coupled between the source node and the second control node with an inverted data bit which is an inverted version of the data bit.

17. The method of claim 16, further comprising synchronizing switching of the inverted data bit with the data bit.

18. The method of claim 16, further comprising level shifting a voltage level of the data bit and the inverted data bit relative to at least one of first and second supply voltages.

19. The method of claim 15, further comprising receiving an input bit and a clock signal and synchronizing switching between a code bit and an inverted code bit with the clock signal based on switching of the input bit.

20. The method of claim 19, further comprising voltage level shifting the data bit and an inverted data bit relative to the code bit and the inverted code bit.

* * * * *